(12) United States Patent
Liu et al.

(10) Patent No.: US 12,306,510 B2
(45) Date of Patent: May 20, 2025

(54) ARRAY SUBSTRATE AND METHOD FOR MANUFACTURING SAME, DISPLAY PANEL, AND DISPLAY DEVICE

(71) Applicants: Hefei BOE Optoelectronics Technology Co., Ltd., Anhui (CN); BOE Technology Group Co., Ltd., Beijing (CN)

(72) Inventors: Yanni Liu, Beijing (CN); Hui Wang, Beijing (CN); Hongmin Li, Beijing (CN)

(73) Assignees: Hefei BOE Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/602,989

(22) Filed: Mar. 12, 2024

(65) Prior Publication Data
US 2025/0076721 A1    Mar. 6, 2025

Related U.S. Application Data

(63) Continuation of application No. PCT/CN2023/116120, filed on Aug. 31, 2023.

(51) Int. Cl.
*G02F 1/1333* (2006.01)
*G02F 1/1335* (2006.01)
(Continued)

(52) U.S. Cl.
CPC ...... *G02F 1/1368* (2013.01); *G02F 1/133357* (2021.01); *G02F 1/133512* (2013.01);
(Continued)

(58) Field of Classification Search
CPC ............ G02F 1/1368; G02F 1/133357; G02F 1/133512; G02F 1/133514; G02F 1/13439;
(Continued)

(56) References Cited

U.S. PATENT DOCUMENTS

2004/0036827 A1    2/2004 Tsuda et al.
2006/0139526 A1*   6/2006 Ahn ................. G02F 1/133555
                                                    349/114

FOREIGN PATENT DOCUMENTS

CN    1435714 A    8/2003
CN    1525224 A    9/2004
(Continued)

OTHER PUBLICATIONS

PCT/CN2023/116120 international search report dated Nov. 16, 2023.

*Primary Examiner* — James A Dudek
(74) *Attorney, Agent, or Firm* — IPro, PLLC (57) ABSTRACT

Provided is an array substrate, including a first base substrate, and a drive circuit layer, a transmissive electrode layer and a reflective electrode layer which are sequentially laminated. A plurality of gate lines and a plurality of data lines in the drive circuit layer extend in a first direction and a second direction, respectively, and intersect to define a plurality of pixel regions. Each pixel region includes a transmissive region and a reflective region. The transmissive region includes at least one first region and at least one second region connected to each other. The first region and the second region are between adjacent two reflective regions. The reflective electrode layer includes reflective electrodes in one-to-one correspondence with reflective regions and cover the corresponding reflective regions. The transmissive electrode layer includes transmissive elec-
(Continued)

trodes in one-to-one correspondence with transmissive regions and at least cover the corresponding transmissive regions.

19 Claims, 6 Drawing Sheets

(51) Int. Cl.
*G02F 1/1343* (2006.01)
*G02F 1/1362* (2006.01)
*G02F 1/1368* (2006.01)
*H10D 86/40* (2025.01)
*H10D 86/60* (2025.01)

(52) U.S. Cl.
CPC .... *G02F 1/133514* (2013.01); *G02F 1/13439* (2013.01); *G02F 1/136286* (2013.01); *H10D 86/441* (2025.01); *H10D 86/60* (2025.01)

(58) Field of Classification Search
CPC ......... G02F 1/136286; G02F 1/133555; H01L 27/124
See application file for complete search history.

(56) References Cited

FOREIGN PATENT DOCUMENTS

| | | |
|---|---|---|
| CN | 102566133 A | 7/2012 |
| CN | 102645774 A | 8/2012 |
| CN | 218917880 U | 4/2023 |

\* cited by examiner

ARRAY SUBSTRATE AND METHOD FOR MANUFACTURING SAME, DISPLAY PANEL, AND DISPLAY DEVICE

CROSS-REFERENCE TO RELATED APPLICATION

This application is a continuation application of international application No. PCT/CN2023/116120, filed on Aug. 31, 2023, the content of which is herein incorporated by reference in its entirety.

TECHNICAL FIELD

Embodiments of the present disclosure relate to the field of display technology, and in particular relates to an array substrate and a method for manufacturing the same, a display panel, and a display device.

BACKGROUND

Transreflective type liquid crystal display devices have a reflective display mode and a transmissive display mode. In a high light intensity environment, the reflective display mode can maintain the contrast of the screen display and reduces power consumption; and in an environment with insufficient light brightness, the transmissive display mode can use a backlight source to achieve supplementary display. The display panel of a transreflective type liquid crystal display device includes a first substrate and a second substrate facing each other, and a liquid crystal layer disposed between the first substrate and the second substrate.

SUMMARY

The present disclosure provides an array substrate and a method for manufacturing the same, a display panel, and a display device.

According to some embodiments of the present disclosure, an array substrate is provided. The array substrate includes a first base substrate, and a drive circuit layer, a transmissive electrode layer and a reflective electrode layer which are sequentially laminated on the first base substrate; wherein the drive circuit layer includes a plurality of gate lines and a plurality of data lines, wherein the plurality of gate lines extend in a first direction, the plurality of data lines extend in a second direction, and the plurality of gate lines and the plurality of data lines intersect to define a plurality of pixel regions; wherein each of the pixel regions includes a transmissive region and a reflective region, and the transmissive region in at least one of the pixel regions includes at least one first region and at least one second region that are connected to each other, wherein the first region is between adjacent two reflective regions in the first direction and a length direction of the first region is the same as the second direction, and the second region is between adjacent two reflective regions in the second direction and a length direction of the second region is the same as the first direction; the reflective electrode layer includes a plurality of reflective electrodes, wherein the plurality of reflective electrodes are in one-to-one correspondence with a plurality of reflective regions and cover the corresponding reflective regions, respectively; and the transmissive electrode layer includes a plurality of transmissive electrodes, wherein the plurality of transmissive electrodes are in one-to-one correspondence with a plurality of transmissive regions, and each of the transmissive electrodes at least covers the corresponding transmissive region.

In some embodiments, the transmissive region in at least one of the pixel regions includes one first region and one second region.

In some embodiments, the plurality of pixel regions include a first pixel region and a second pixel region that are adjacent to each other in the first direction, wherein the reflective electrode in the first pixel region is a first reflective electrode, the reflective electrode in the second pixel region is a second reflective electrode, and the transmissive electrode in the first pixel region is a first transmissive electrode; wherein an orthographic projection of the first transmissive electrode on a bearing surface of the first base substrate overlaps with orthographic projections of the first reflective electrode and the second reflective electrode on the bearing surface of the first base substrate.

In some embodiments, the plurality of pixel regions include a third pixel region and a fourth pixel region that are adjacent to each other in the second direction, wherein the reflective electrode in the third pixel region is a third reflective electrode, the reflective electrode in the fourth pixel region is a fourth reflective electrode, and the transmissive electrode in the third pixel region is a second transmissive electrode; wherein an orthographic projection of the second transmissive electrode on a bearing surface of the first base substrate overlaps with orthographic projections of the third reflective electrode and the fourth reflective electrode on the bearing surface of the first base substrate.

In some embodiments, in the first direction, a spacing between the reflective regions of adjacent two pixel regions is greater than or equal to 6 μm; and in the second direction, a spacing between the reflective regions of adjacent two pixel regions is greater than or equal to 6 μm.

In some embodiments, the drive circuit layer further includes a plurality of pixel drive circuits, the plurality of pixel drive circuits are in one-to-one correspondence with the plurality of pixel regions; wherein the plurality of pixel drive circuits are disposed in the reflective regions of the corresponding pixel regions, respectively.

In some embodiments, the array substrate further includes a passivation layer, and the passivation layer is disposed between the drive circuit layer and the transmissive electrode layer; wherein the passivation layer is provided with a plurality of via holes, each the pixel drive circuits is electrically connected to the corresponding transmissive electrode through at least one of the via holes, and each of the via holes is in the reflective region of the corresponding pixel region.

In some embodiments, the array substrate further includes a planarization layer, wherein the planarization layer is disposed between the reflective electrode layer and the transmissive electrode layer.

In some embodiments, the planarization layer includes a plurality of isolation blocks, wherein the plurality of isolation blocks are in one-to-one correspondence with the plurality of pixel regions, and the plurality of isolation blocks are disposed in the corresponding pixel regions, respectively; in a same pixel region, the reflective electrode is disposed on a top surface and least one sidewall of a plurality of sidewalls of the isolation block, and a side surface, away from the top surface of the isolation block, of the reflective electrode disposed on the sidewall is connected to a transmissive electrode.

In some embodiments, an orthographic projection of the data line on a bearing surface of the first base substrate at least partially overlaps with an orthographic projection of the reflective electrode on the bearing surface of the first base substrate.

In some embodiments, the reflective electrode layer is made of argentum or aluminum.

According to some embodiments of the present disclosure, the embodiments of the present disclosure provide an array substrate. The array substrate includes: a first base substrate, and a drive circuit layer, a transmissive electrode layer and a reflective electrode layer which are sequentially laminated on the first base substrate, wherein the drive circuit layer includes a plurality of gate lines and a plurality of data lines, the plurality of gate lines extend in a first direction, the plurality of data lines extend in a second direction, and the plurality of gate lines and the plurality of data lines intersect to define a plurality of pixel regions; wherein the reflective electrode layer includes a plurality of reflective electrodes arranged in an array, and each of the reflective electrodes is disposed in a corresponding pixel region; the transmissive electrode layer includes a plurality of transmissive electrodes arranged in an array, and each of the transmissive electrodes is disposed in a corresponding pixel region; a first reflective electrode of the plurality of reflective electrodes and a first transmissive electrode of the plurality of transmissive electrodes are insulated from each other, and an orthographic projection of the first reflective electrode on the first base substrate partially overlaps with an orthographic projection of the first transmissive electrode on the first base substrate, the first reflective electrode is disposed in a first pixel region, and the first transmissive electrode is disposed in a second pixel region, wherein the first pixel region and the second pixel region are two pixel regions adjacent to each other in the first direction or the second direction.

According to some embodiments of the present disclosure, a method for manufacturing an array substrate is provided. The method includes: providing a first base substrate; and manufacturing a drive circuit layer, a transmissive electrode layer and a reflective electrode layer which are sequentially laminated on a side of the first base substrate; wherein the drive circuit layer includes a plurality of gate lines and a plurality of data lines, the plurality of gate lines extend in a first direction, the plurality of data lines extend in a second direction, and the plurality of gate lines and the plurality of data lines intersect to define a plurality of pixel regions; wherein each of the pixel regions includes a transmissive region and a reflective region, and the transmissive region in at least one of the pixel regions includes at least one first region and at least one second region that are connected to each other, wherein the first region is between adjacent two reflective regions in the first direction and a length direction of the first region is the same as the second direction, and the second region is between adjacent two reflective regions in the second direction and a length direction of the second region is the same as the first direction; the reflective electrode layer includes a plurality of reflective electrodes, wherein the plurality of reflective electrodes are in one-to-one correspondence with a plurality of reflective regions and cover the corresponding reflective regions, respectively; and the transmissive electrode layer includes a plurality of transmissive electrodes, wherein the plurality of transmissive electrodes are in one-to-one correspondence with a plurality of transmissive regions, and each of the transmissive electrodes at least covers the corresponding transmissive region.

According to some embodiments of the present disclosure, a display panel is provided. The display panel includes: a first substrate and a second substrate facing each other, and a liquid crystal layer disposed between the first substrate and the second substrate, wherein the first substrate is any one of the array substrates described above.

In some embodiments, the second substrate includes a transparent substrate; or the second substrate includes a second base substrate, and a light-shielding layer and a color film layer which are laminated on the second base substrate, wherein the color film layer includes a plurality of color resistance blocks arranged in an array in the first direction and the second direction, wherein the plurality of color resistance blocks are in one-to-one correspondence with the plurality of pixel regions, adjacent two color resistance blocks in the second direction are the same in color, and adjacent two color resistance blocks in the first direction are different in color; and the light-shielding layer includes a plurality of light-shielding strips, wherein the plurality of light-shielding strips are disposed between the plurality of color resistance blocks, and the plurality of light-shielding strips are arranged in parallel and spaced apart from each other and extend in the second direction.

According to some embodiments of the present disclosure, a display device is provided. The display device includes any one of the display panels described above and a backlight module, wherein the backlight module is configured to provide a light source for the display panel.

BRIEF DESCRIPTION OF DRAWINGS

For a clearer description of the technical solutions in the embodiments of the present disclosure, the following briefly introduces the accompanying drawings required for describing the embodiments. The accompanying drawings in the following descriptions show merely some embodiments of the present disclosure, and persons of ordinary skill in the art may still derive other drawings from these accompanying drawings without creative effort.

REFERENCE NUMERALS IN THE DRAWINGS x—first direction; y—second direction; m—transmissive region; n—reflective region;
m1—first region of the transmissive region; m2—second region of the transmissive region;
1—array substrate/first substrate; 11—first base substrate;
12—drive circuit layer; 120—pixel drive circuit; 121—gate line; 122—data line;
123—gate layer; 124—gate insulating layer; 125—active layer; 126—source/drain layer;
13—transmissive electrode layer; 130—transmissive electrode;
14—reflective electrode layer; 140—reflective electrode;
15—passivation layer; 150—via hole;
16—planarization layer; 160—isolation block;
2—second substrate; 21—second base substrate; 22—light-shielding layer; 221—light-shielding strip;
23—color film layer; 3—liquid crystal layer.

DETAILED DESCRIPTION

To make the objectives, technical solutions and advantages of the present disclosure clearer, the embodiments of the present disclosure will be further described in detail below with reference to the accompanying drawings.

Terms in the section of the detailed description of the present disclosure are merely used for the purpose of explaining the embodiments of the present disclosure, and are not intended to limit the present disclosure. Unless otherwise defined, the technical terms or scientific terms used in the embodiments of the present disclosure shall be taken to mean the ordinary meanings as understood by those of ordinary skill in the art to which the present disclosure belongs. The terms "first," "second," "third," and similar terms used in the description and claims of the present disclosure do not denote any order, quantity, or importance, but rather are merely used to distinguish different components. Similarly, "one," "a/an," and similar terms are not intended to limit the quantity but indicate the presence of at least one. The term "include" or "comprise" and similar terms are intended to mean that the element or object before "include" or "comprise" covers the elements or objects or equivalents listed after "include" or "comprise," without excluding other elements or objects. The orientation terms "top," "bottom," "on," "under," "left," "right," and the like in the present disclosure only indicate the orientation with reference to the drawings. Therefore, the orientation terms are used to illustrate and help understand the embodiments of the present disclosure better and more clearly, rather than indicate or imply that the device or element referred to must have a particular orientation, be constructed and operated in a particular orientation, and therefore are not to be construed as a limitation of the embodiments of the present disclosure.

In some practices, the first substrate includes a base substrate, and a drive circuit layer, a transmissive electrode layer, and a reflective electrode layer which are sequentially laminated on the base substrate. The drive circuit layer includes a plurality of gate lines and a plurality of data lines, the plurality of gate lines extend in a first direction, the plurality of data lines extend in a second direction, and the plurality of gate lines and the plurality of data lines intersect to define a plurality of pixel regions. The transmissive electrode layer includes a plurality of transmissive electrodes, and the plurality of transmissive electrodes are disposed in the corresponding pixel regions, respectively. The reflective electrode layer includes a plurality of reflective electrodes, and the plurality of reflective electrodes are disposed in the corresponding pixel regions, respectively.

However, in order to prevent adjacent reflective electrodes from growing in air and lapping on each other to result in a short circuit, adjacent two reflective electrodes need to have a large spacing therebetween, resulting in a large spacing between adjacent two pixel regions and a small pixel aperture ratio.

Figure 1:
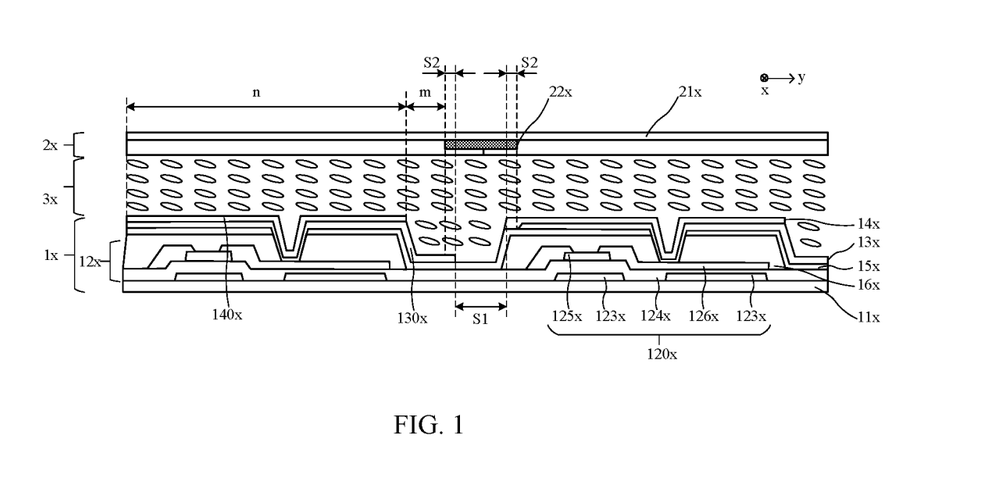
FIG. 1 is a schematic diagram of a cross-sectional structure of a display panel in the related art.

FIG. 1 is a schematic diagram of a cross-sectional structure of a display panel in the related art. As shown in FIG. 1, the display panel in the related art includes a first substrate 1x and a second substrate 2x facing each other, and a liquid crystal layer 3x disposed between the first substrate 1x and the second substrate 2x. The first substrate 1x includes a first base substrate 11x, and a drive circuit layer 12x, a transmissive electrode layer 13x, and a reflective electrode layer 14x which are sequentially laminated on the first base substrate 11x.

Figure 2:
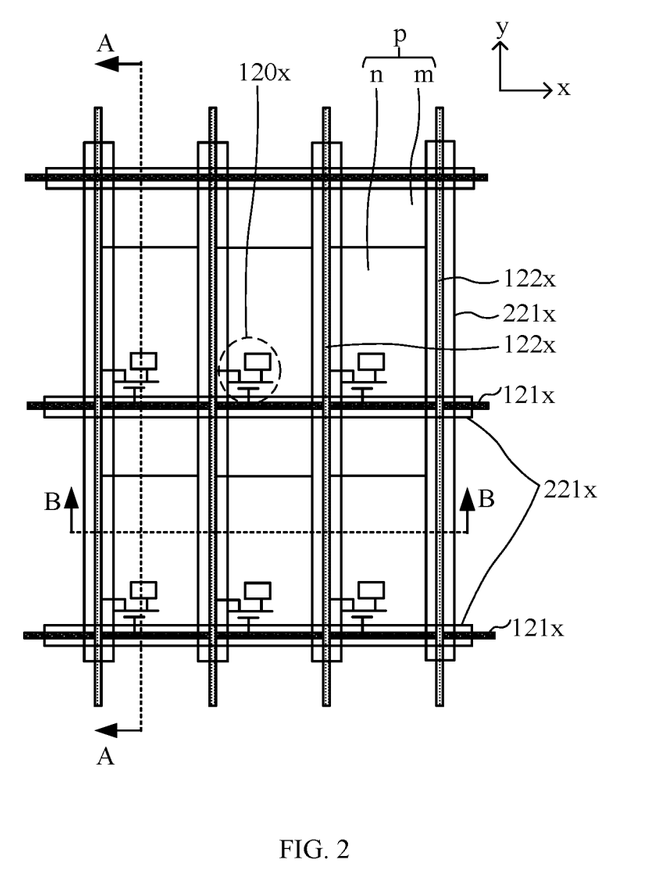
FIG. 2 is a schematic diagram of a top view structure of a display panel in the related art.

FIG. 2 is a schematic diagram of a top view structure of the display panel of FIG. 1, and FIG. 1 is a cross-sectional view of FIG. 2 along line AA. As shown in FIG. 2, the drive circuit layer 12x includes a plurality of gate lines 121x and a plurality of data lines 122x, the plurality of gate lines 121x extend in a first direction x, and the plurality of data lines 122x extend in a second direction y. The plurality of gate lines 121x and the plurality of data lines 122x intersect to define a plurality of pixel regions p. A plurality of pixel regions p correspond to one pixel. Each pixel region p includes a transmissive region m and a reflective region n.

Figure 3:
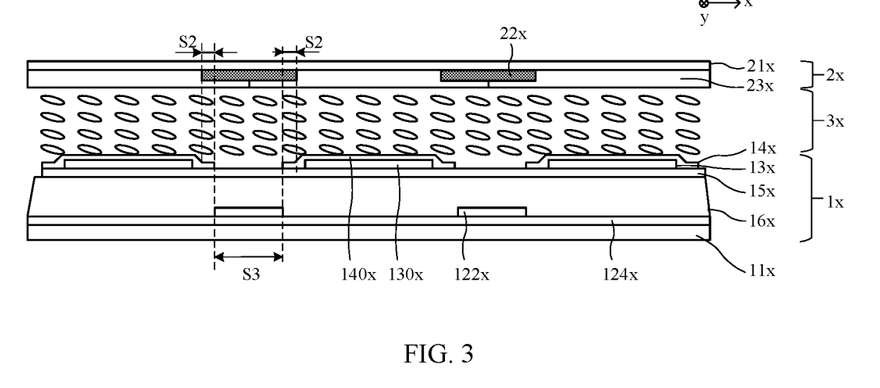
FIG. 3 is a schematic diagram of a cross-sectional structure of a display panel in the related art.

FIG. 3 is a cross-sectional view of FIG. 2 along a BB cross-sectional line. In combination with FIGS. 1, 2, and 3, the reflective electrode layer 14x includes a plurality of reflective electrodes 140x, the plurality of reflective electrodes 140x are in one-to-one correspondence with the plurality of reflective regions n, and each of the reflective electrodes 140x covers the corresponding reflective region n. In combination with FIGS. 1 and 2, the transmissive electrode layer 13x includes a plurality of transmissive electrodes 130x, the plurality of transmissive electrodes 130x are in one-to-one correspondence with the plurality of transmissive regions m, and each of the transmissive electrodes 130x covers the corresponding transmissive region m. In one pixel region, the transmissive region m is on a side of the reflective region n in the second direction y.

The spacing between adjacent two reflective electrodes 140x must not be less than a limiting distance, otherwise the reflective electrodes 140x grow in air and lap on each other to result in a short-circuit. In the related art, in the first direction x and the second direction y, the distance between adjacent two reflective regions is greater than or equal to the limiting distance, so as to avoid the problem that adjacent two reflective electrodes 140x grow in air and lap on each other due to the short distance therebetween to result in a short-circuit. In the related art, for the design in which the transmissive region m is on a side of the reflective region n in the second direction y in a pixel region p, the region between adjacent two reflective regions n in the second direction y is utilized. However, there is no transmissive region m between adjacent two reflective regions n in the first direction x, i.e., the region between adjacent two reflective regions n is not fully utilized, and the aperture ratio is thus limited.

For a transreflective type liquid crystal display panel, in the transmissive display mode, i.e., when a backlight source supplements display, in order to prevent the backlight source from leaking light from the gap between adjacent two pixel regions, a light-shielding layer needs to be provided on the second substrate 2x to block light.

As shown in FIGS. 1 to 3, the second substrate 2x includes a second base substrate 21x, and a light-shielding layer 22x and a color film layer 23x which are sequentially laminated on the second base substrate 21x. The color film layer 23x includes a plurality of color resistance blocks arranged in an array, and the light-shielding layer 22x includes a black matrix structure and the black matrix structure is disposed between adjacent two color resistance blocks. In the first direction x, the width of the black matrix is determined together by the limiting distance and the process fluctuation control capability. In the first direction x, the width of the black matrix is at least equal to the sum of the limiting distance S3 and two times the process alignment fluctuation value S2 of the first substrate and the second substrate, i.e., S3+2*S2. In the second direction y, the width of the black matrix is at least equal to the sum of S1 and two times the process alignment fluctuation value S2 of the first substrate and the second substrate, i.e., S1+2*S2, wherein S1 is the size of the spacing between two pixel regions as determined based on process alignment requirements. Generally, S1 is smaller than S3.

As can be seen, in the related art, in the first direction x, the spacing between adjacent two pixel regions is limited by the limiting distance, and the pixel aperture ratio is also limited by the limiting distance. For this, the embodiments of the present disclosure provide an array substrate capable of reducing the spacing between adjacent two pixel regions and increasing the pixel aperture ratio.

Figure 4:
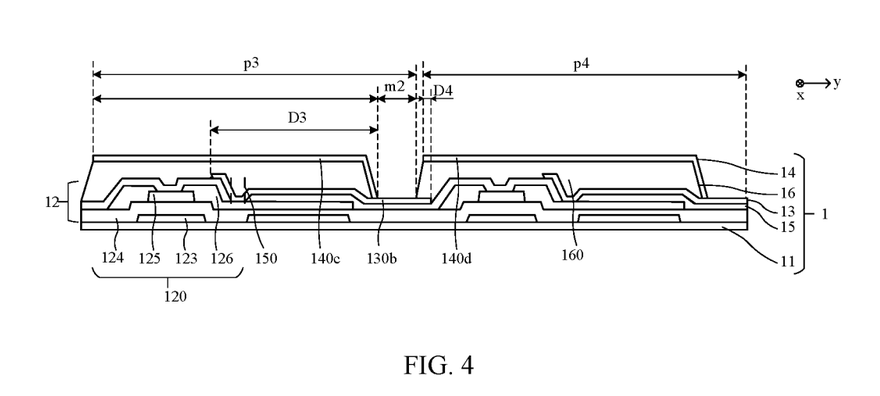
FIG. 4 is a schematic diagram of a cross-sectional structure of an array substrate according to some embodiments of the present disclosure.

FIG. 4 is a schematic diagram of a cross-sectional structure of an array substrate according to some embodiments of the present disclosure. As shown in FIG. 4, the array substrate 1 includes a first base substrate 11, and a drive circuit layer 12, a transmissive electrode layer 13 and a reflective electrode layer 14 which are sequentially laminated on the first base substrate 11.

Figure 5:
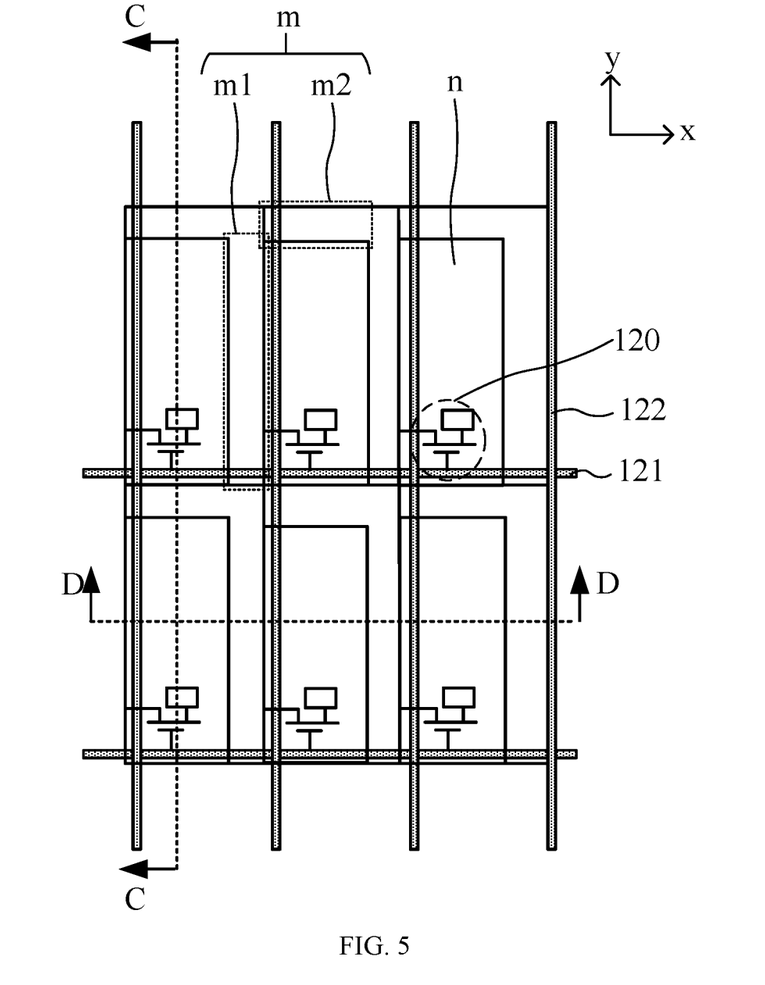
FIG. 5 is a schematic diagram of a top view structure of an array substrate according to some embodiments of the present disclosure.

FIG. 5 is a schematic diagram of a top view structure of an array substrate according to some embodiments of the present disclosure, and FIG. 4 is a cross-sectional view of FIG. 5 along line CC. As shown in FIG. 5, the drive circuit layer 12 includes a plurality of gate lines 121 and a plurality of data lines 122, the plurality of gate lines 121 extend in a first direction x, and the plurality of data lines 122 extend in a second direction y. The plurality of gate lines 121 and the plurality of data lines 122 intersect to define a plurality of pixel regions.

Each pixel region includes a transmissive region m and a reflective region n, and the transmissive region m in each pixel region includes a first region m1 and a second region m2 that are connected. In the first direction x, the first region m1 is between adjacent two reflective regions n, and the length direction of the first region m1 is the same as the second direction y. In the second direction y, the second region m2 is between adjacent two reflective regions n, and the length direction of the second region m2 is the same as the first direction x. The reflective electrode layer 14 includes a plurality of reflective electrodes 140, and the plurality of reflective electrodes 140 are in one-to-one correspondence with the plurality of reflective regions n and cover the corresponding reflective regions n, respectively. The transmissive electrode layer 13 includes a plurality of transmissive electrodes 130, the plurality of transmissive electrodes 130 are in one-to-one correspondence with the plurality of transmissive regions m, and each transmissive electrode 130 at least covers the corresponding transmissive region m.

In the embodiments of the present disclosure, "each reflective electrode 140 covers the corresponding reflective region n" means that the reflective electrode 140 fills the reflective region n, or that the coverage range of the reflective region n is the same as the coverage range of the reflective electrode 140. "Each transmissive electrode 130 at least covers the corresponding transmissive region m" means that the transmissive electrode 130 at least fills the transmissive region m and extends beyond the transmissive region m.

In the embodiments of the present disclosure, a portion of the transmissive electrode 130 is present between adjacent two reflective electrodes 140, and this portion of the transmissive electrode 130 occupies a certain space. When the size of this space in the arrangement direction of these two reflective electrodes 140 is greater than the limiting distance, the spacing between adjacent two pixel regions is determined based on the process alignment requirements only, and the size of the spacing is S1. When the process alignment precision is high enough, the spacing between adjacent two pixel regions can be infinitely small theoretically. When the size of the space in the arrangement direction of these two reflective electrodes 140 is smaller than the limiting distance, the spacing between the adjacent two pixel regions is limited by the difference between the limiting distance and the size of the space in the arrangement direction of these two reflective electrodes 140. By arranging a transmissive region m between adjacent two reflective regions n in both the first direction x and the second direction y, the region of which the size needs to be greater than or equal to the limiting distance between adjacent two reflective electrodes 140 in the first direction x and the second direction y can be fully utilized. Thus, the display panel provided in the embodiments of the present disclosure can have a higher aperture ratio under the premise that the ratio of the area of the transmissive region to the area of the reflective region is the same as that in the related art.

In other possible embodiments, each pixel region includes a transmissive region m and a reflective region n, and the transmissive region m in at least one pixel region includes two first regions m1 and two second regions m2 that are connected. In the first direction x, the two first regions m1 each are between adjacent two reflective regions n, and are on two sides of the reflective region n of the pixel region in which the two first regions m1 are located, and the length direction of the first region m1 is the same as the second direction y. In the second direction y, the two second regions m2 each are between adjacent two reflective regions n, and are on two sides of the reflective region n of the pixel region in which the two second regions m2 are located, and the length direction of the second region m2 is the same as the first direction x.

In other possible embodiments, each pixel region includes a transmissive region m and a reflective region n. In some of the pixel regions, the transmissive region m includes the first region m1 and the second region m2 that are connected as described above, and in the other the pixel regions, the transmissive region m only includes the first region m1 or the second region m2.

In the embodiments of the present disclosure, in at least two adjacent pixel regions, the reflective electrode in one pixel region and the transmissive electrode in the other pixel region are insulated from each other, and the orthographic projection of the reflective electrode in one pixel region on the first base substrate 11 partially overlaps with the orthographic projection of the transmissive electrode in the other pixel region on the first base substrate 11.

In some embodiments, the two adjacent pixel regions are two pixel regions adjacent in the first direction x or two pixel regions adjacent in the second direction y.

Figure 6:
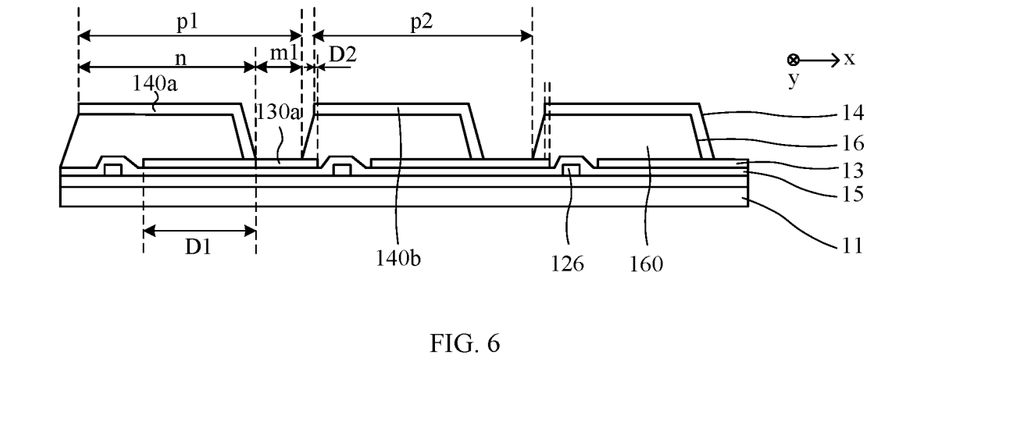
FIG. 6 is a schematic diagram of a cross-sectional structure of an array substrate according to some embodiments of the present disclosure.

The positional relationship between the reflective electrode 140 and the transmissive electrode 130 is described below by taking the reflective electrodes 140 in any two adjacent pixel regions and the transmissive electrode 130 between these two reflective electrodes 140 as an example. As shown in FIG. 4 and FIG. 6, in both the first direction x and the second direction y, the transmissive electrode 130 not only covers the first region m1 or the second region m2 in the corresponding transmissive region m, but also partially covers adjacent two reflective regions n. Therefore, the region between the two adjacent pixel regions is filled with the two reflective electrodes and the transmissive electrode without any gaps, which can prevent the backlight source of the display panel from light leakage in the transmissive display mode.

FIG. 6 is a schematic diagram of a cross-sectional structure of an array substrate according to some embodiments of the present disclosure, and FIG. 6 is a cross-sectional view of FIG. 5 along line DD. As shown in FIG. 6, the plurality of pixel regions include a first pixel region p1 and a second pixel region p2 adjacent to each other in the first direction x. The reflective electrode 140 in the first pixel region p1 is a first reflective electrode 140a, the reflective electrode 140 in the second pixel region p2 is a second reflective electrode 140b, and the transmissive electrode 130 in the first pixel region p1 is a first transmissive electrode 130a. The orthographic projection of the first transmissive electrode 130a on the bearing surface of the first base substrate 11 overlaps with the orthographic projections of both the first reflective electrode 140a and the second reflective electrode 140b on the bearing surface of the first base substrate 11.

In some embodiments, the sub-pixels corresponding to the first pixel region p1 and the second pixel region p2 belong to the same one pixel or different pixels.

In the first direction x, the first transmissive electrode 130a not only covers the corresponding transmissive region, but also partially covers adjacent two reflective regions. Therefore, the region between the adjacent first pixel region p1 and second pixel region p2 is filled with the first reflective electrode 140a, the second reflective electrode 140b, and the first transmissive electrode 130a without any gaps, and the spacing between the adjacent pixel regions is small or even there is no spacing therebetween, which can further increase the pixel aperture ratio.

In some embodiments, the width of the overlapping portion between the orthographic projection of the first transmissive electrode 130a on the bearing surface of the first base substrate 11 and the orthographic projection of the first reflective electrode 140a on the bearing surface of the first base substrate 11 is D1; and the width of the overlapping portion between the orthographic projection of the first transmissive electrode 130a on the bearing surface of the first base substrate 11 and the orthographic projection of the second reflective electrode 140b on the bearing surface of the first base substrate 11 is D2. The sum of D1, D2 and the alignment process fluctuation value is less than the size of one pixel region in the first direction x, such that two reflective electrodes 140 adjacent in the first direction x are not in contact with each other.

In the embodiments of the present disclosure, referring to FIG. 4 again, the plurality of pixel regions include a third pixel region and a fourth pixel region adjacent to each other in the second direction y. The reflective electrode 140 in the third pixel region is a third reflective electrode 140c, the reflective electrode 140 in the fourth pixel region is a fourth reflective electrode 140d, and the transmissive electrode 130 in the third pixel region is a second transmissive electrode 130b. The orthographic projection of the second transmissive electrode 130b on the bearing surface of the first base substrate 11 overlaps with the orthographic projections of both the third reflective electrode 140c and the fourth reflective electrode 140d on the bearing surface of the first base substrate 11.

In the second direction y, the second transmissive electrode 130b not only covers the corresponding transmissive region, but also partially covers adjacent two reflective regions. Therefore, the region between the adjacent third pixel region p3 and fourth pixel region p4 is filled with the third reflective electrode 140c, the fourth reflective electrode 140d, and the second transmissive electrode 130b without any gaps, which can prevent the backlight source of the display panel from light leakage.

In some embodiments, the width of the overlapping portion between the orthographic projection of the second transmissive electrode 130b on the bearing surface of the first base substrate 11 and the orthographic projection of the third reflective electrode 140c on the bearing surface of the first base substrate 11 is D3; and the width of the overlapping portion between the orthographic projection of the second transmissive electrode 130b on the bearing surface of the first base substrate 11 and the orthographic projection of the fourth reflective electrode 140d on the bearing surface of the first base substrate 11 is D4. The sum of D3, D4 and the alignment process fluctuation value is less than the size of one pixel region in the second direction y, such that two reflective electrodes 140 adjacent in the second direction y are not in contact with each other.

In other possible embodiments, in the first direction x, the first transmissive electrode 130a only covers the corresponding transmissive region. Thus, in the adjacent first pixel region and the second pixel region, the orthographic projection of the first transmissive electrode 130a on the bearing surface of the first base substrate 11 is connected without any gaps with the orthographic projections of the first reflective electrode 140a and the second reflective electrode 140b on the bearing surface of the first base substrate 11. In the second direction y, the second transmissive electrode 130b only covers the second transmissive region. Thus, the orthographic projection of the second transmissive electrode 130b on the bearing surface of the first base substrate 11 is connected without any gaps with the orthographic projections of the third reflective electrode 140c and the fourth reflective electrode 140d on the bearing surface of the first base substrate 11.

Exemplarily, the reflective electrode layer 14 is made of a metal material, such as argentum or aluminum. Both argentum and aluminum have high reflectivity and are suitable for making the reflective electrode layer 14. The reflectivity of argentum is higher, but the reflective electrode made of argentum reacts with sulfur, sulfides, oxygen, and the like in air to form silver sulfide particles or silver oxide particles, and the silver sulfide particles or silver oxide particles gradually increase in size. If adjacent two reflective electrodes made of argentum are arranged too closely, the silver sulfide particles or silver oxide particles generated by the reflective electrode made of argentum gradually increase in size to cover the adjacent reflective electrode, resulting in a short-circuit due to lapping. Therefore, the embodiments of the present disclosure are particularly applicable for the reflective electrode layer made of argentum.

Exemplarily, the spacing between the reflective regions n of adjacent two pixel regions is greater than or equal to 6 μm in the first direction x, and the spacing between the reflective regions n of adjacent two pixel regions is greater than or equal to 6 μm in the second direction y. The spacing between adjacent two reflective electrodes 140 made of argentum needs to be greater than or equal to 6 μm, otherwise the problem that the silver sulfide particles or silver oxide particles generated by the reflective electrodes grow in air to result in the short-circuit due to lapping occurs. Therefore, the spacing between adjacent two reflective regions n needs to be greater than or equal to 6 μm. In some embodiments, the spacing between the reflective regions n of adjacent two pixel regions in the first direction x is smaller than the size of the pixel region in the first direction x; and the spacing between the reflective regions n of adjacent two pixel regions in the second direction y is smaller than the size of the pixel region in the second direction y. The specific sizes need to be determined according to the area of the transmissive region required by the product.

Exemplarily, as shown in FIG. 4 and FIG. 5, the drive circuit layer 12 further includes a plurality of pixel drive circuits 120, and the plurality of pixel drive circuits 120 are in one-to-one correspondence with the plurality of pixel regions. That is, one pixel drive circuit 120 is provided in each pixel region. Each pixel drive circuit 120 is disposed in the reflective region n of the corresponding pixel region, and the plurality of pixel drive circuits 120 are respectively disposed in the reflective regions n of the corresponding pixel regions, i.e., below the corresponding reflective electrodes 140 and are shielded by the corresponding reflective electrodes 140. Therefore, there is no need to provide other structures to shield the pixel drive circuits 120, which helps increase the aperture ratio.

Exemplarily, as shown in FIG. 5 and FIG. 6, the orthographic projection of the data line 122 on the bearing surface of the first base substrate 11 at least partially overlaps with the orthographic projection of the reflective electrode 140 on the bearing surface of the first base substrate 11. Since the reflective electrode 140 can shield the data line 122 below, it can increase the aperture ratio to arrange the data line 122 below the reflective electrode 140.

Exemplarily, as shown in FIG. 4, the array substrate 1 further includes a passivation layer 15, and the passivation layer 15 is disposed between the drive circuit layer 12 and the transmissive electrode layer 13. The passivation layer 15 is provided with a plurality of via holes 150 therein, and each pixel drive circuit 120 is electrically connected to the corresponding transmissive electrode 130 through at least one via hole 150. The via hole 150 is in the reflective region of the corresponding pixel region.

In order to connect the transmissive electrodes 130 to the drive circuit layer 12, via holes for connecting the transmissive electrodes 130 to the drive circuit layer 12 need to be formed in the film layers between the transmissive electrode layer 13 and the first base substrate 11.

In the related art, as can be seen from FIG. 1, in the reflective region n, the reflective electrode layer 14x is electrically connected to the drive circuit layer 12x through the via hole in the passivation layer 15x and other film layers. Since the film layers between the reflective electrode layer 14x and the drive circuit layer 12x are relatively thick, the via hole makes the reflective plane of the reflective region n which is closest to the light-exiting side uneven, resulting in the decrease of the effective reflectivity of the reflective region n. In the embodiments of the present disclosure, the transmissive electrode layer 13 is connected to the source/drain layer 126 of the drive circuit layer 12 through the via hole 150 in the passivation layer 15. Since the passivation layer 15 in the embodiments of present disclosure is thinner than the passivation layer 15x and the other film layers in the related art, the depression at the via hole 150 in the passivation layer 15 is shallower. Thus, the via holes 150 in the embodiments of the present disclosure have less effect on the flatness of the reflective electrode 140, which can increase the effective reflectivity of the reflective region n.

Optionally, the shape of the via hole 150 is not limited in the embodiments of the present disclosure, and is in the shape of a cylinder, a circular truncated cone, a frustum of a prism, or a prism.

Exemplarily, as shown in FIG. 4, the array substrate further includes a planarization layer 16, and the planarization layer 16 is disposed between the reflective electrode layer 14 and the transmissive electrode layer 13. By providing the thick planarization layer 16, the mutual interaction between the potential of the reflective electrode 140 in one of adjacent two pixel regions and the potential of the transmissive electrode 130 in the other one of the adjacent two pixel regions can be reduced. Furthermore, the thickness of the liquid crystal layer in the transmissive region m can be adjusted by digging out the planarization layer 16 in the transmissive region m, and an optimal cell gap design in the transmissive region can be achieved in combination with an adjustment of the refractive index of liquid crystals. In some embodiments, the liquid crystal cell gap in the transmissive region m is about two times the liquid crystal cell gap in the reflective region n.

Exemplarily, as shown in FIG. 4, the planarization layer 16 includes a plurality of isolation blocks 160. The plurality of isolation blocks 160 are in one-to-one correspondence with the plurality of pixel regions, and the isolation blocks 160 are disposed in the corresponding pixel regions, respectively. In the same pixel region, the reflective electrode 140 is disposed on a top surface and at least one sidewall of a plurality of sidewalls of the isolation block 160, and the side surface, away from the top surface of the isolation block 160, of the reflective electrode 140 disposed on the sidewall is connected to the transmissive electrode 130. The reflective electrode 140 is connected to the transmissive electrode 130. Thus, the reflective electrode 140 can be electrically connected to the drive circuit layer 12 disposed below by the transmissive electrode 130. This arrangement can prevent the via hole for connecting the reflective electrode layer 14 and the drive circuit layer 12 which is formed in the reflective region n from affecting the reflecting effect of the reflective electrode 140. In some embodiments, a portion of the reflective electrode 140 extends to the side face of the transmissive electrode 130 away from the first base substrate 11.

Exemplarily, the connection line between the reflective electrode 140 and the transmissive electrode 130 is the boundary line between the reflective region and the transmissive region of the pixel region where the reflective electrode 140 and the transmissive electrode 130 are disposed. As shown in FIG. 4 and FIG. 5, the reflective electrode 140 and the transmissive electrode 130 have a point of intersection in the cross-sectional view of FIG. 4, and this point of intersection extends in the first direction x to be the actual connection line between the reflective electrode 140 and the portion of the transmissive electrode 130 which is adjacent to the reflective electrode 140 in the first direction. This connection line is the boundary line between the second region m2 of the transmissive region and the reflective region n in FIG. 5. As shown in FIG. 5 and FIG. 6, the reflective electrode 140 and the transmissive electrode 130 have a point of intersection in the cross-sectional view of FIG. 6, and this point of intersection extends in the second direction y to be an actual connection line between the reflective electrode 140 and the portion of the transmissive electrode 130 which is adjacent to the reflective electrode 140 in the second direction. This connection line is the boundary line between the first region m1 of the transmissive region and the reflective region n in FIG. 5.

In some embodiments, as shown in FIG. 5, in one pixel region, the transmissive region m is L-shaped, and the reflective region n is rectangular. In other possible embodiments, the transmissive region m is also in the shape of an annular "mouth", which fully surrounds the reflective region n, or a semi-enclosed annular shape with a single side being opened.

Figure 7:
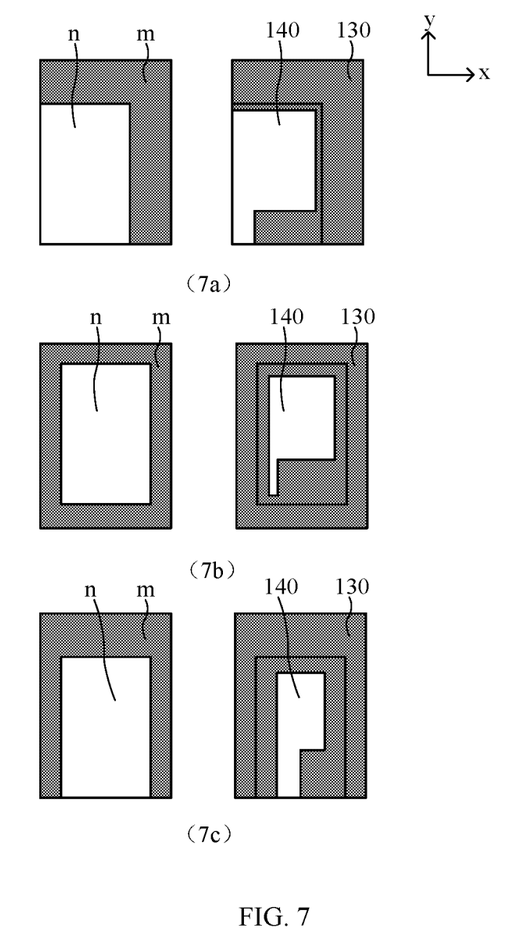
FIG. 7 is a schematic diagram showing orthographic projections of a transmissive electrode and a reflective electrode in a pixel region on a bearing surface of a first base substrate according to some embodiments of the present disclosure.

FIG. 7 is a schematic diagram showing orthographic projections of a transmissive electrode and a reflective electrode in a pixel region on the bearing surface of the first base substrate according to some embodiments of the present disclosure. Please refer to FIG. 7.

In some embodiments, as shown in FIG. 7a, in one pixel region, on the basis that the reflective region n is rectangular, the orthographic projection of the reflective electrode 140 on the bearing surface of the first base substrate 11 is rectangular, the transmissive region m is L-shaped, and the orthographic projection of the transmissive electrode 130 on the bearing surface of the first base substrate 11 is L-shaped, with one edge of the L-shape leading out towards the reflective region n, the transmissive electrode 130 corresponding to the extra projection compared to the L-shape is configured to be connected to the drive circuit layer 12. The reflective electrode 140 actually includes a planar structure disposed on the top surface of the isolation block 160 and a structure that is connected to two side surfaces of the planar structure and extends towards the transmissive electrode 130 disposed in the transmissive region m, that is, the reflective electrode 140 is disposed on the top surface and two side walls of the isolation block 160. Alternatively, the reflective electrode 140 actually includes a planar structure disposed on the top surface of the isolation block 160 and a structure that is connected to one of the two side surfaces, close to the transmissive region m, of the planar structure and extends towards the transmissive electrode 130 disposed in the transmissive region m, that is, the reflective electrode 140 is disposed on the top surface and one side wall of the isolation block 160.

In some embodiments, as shown in FIG. 7b, on the basis that the transmissive region m is in the shape of an annular "mouth", and in one pixel region, the reflective region n is rectangular, the orthographic projection of the reflective electrode 140 on the bearing surface of the first base substrate 11 is rectangular, and the orthographic projection of the transmissive electrode 130 on the bearing surface of the first base substrate 11 is in the shape of an annular "mouth", with any edge of the "mouth" shape leading out towards the reflective region n, the transmissive electrode 130 corresponding to this part of projection is configured to be connected to the drive circuit layer 12. The reflective electrode 140 actually includes a planar structure disposed on the top surface of the isolation block 160 and a structure that is connected to at least part of the plurality of side surfaces of the planar structure and extends towards the transmissive electrode 130 disposed in the transmissive region m, that is, the reflective electrode 140 is disposed on the top surface and at least one side wall of the isolation block 160.

In some embodiments, as shown in FIG. 7c, on the basis that the transmissive region m is in a semi-enclosed annular shape with a single side being opened, and in one pixel region, the reflective region n is rectangular, the orthographic projection of the reflective electrode 140 on the bearing surface of the first base substrate 11 is rectangular, and the orthographic projection of the transmissive electrode 130 on the bearing surface of the first base substrate 11 is in a semi-enclosed annular shape with a single side being opened, with a portion of the semi-enclosed annular shape leading out towards the reflective region n, the transmissive electrode 130 corresponding to this part of projection is configured to be connected to the drive circuit layer 12. The reflective electrode 140 actually includes a planar structure disposed on the top surface of the isolation block 160 and a structure that is connected to at least part of the plurality of side surfaces of the planar structure and extends towards the transmissive electrode 130 disposed in the transmissive region m, that is, the reflective electrode 140 is disposed on the top surface and at least one side wall of isolation block 160.

In the embodiments shown in FIG. 7a, FIG. 7b, and FIG. 7c, since there are fewer joints between the transmissive electrode 130 and the reflective electrode 140 in FIG. 7a, the light effect is less affected by the segment difference between the transmissive electrode 130 and the reflective electrode 140 at the joints thereof in the embodiment of FIG. 7a, and the display effect in the embodiment of FIG. 7a is better.

In one possible implementation, as shown in FIG. 4, the drive circuit layer 12 includes a gate layer 123, a gate insulating layer 124, an active layer 125, and a source/drain layer 126 which are sequentially laminated on the first base substrate 11. In one pixel region, one pixel drive circuit 120 includes at least one thin film transistor (TFT), and each TFT includes a gate in the gate layer 123, and a source and a drain in the source/drain layer 126.

In other possible implementations, the drive circuit layer includes an active layer, a gate insulating layer, a gate layer, an insulating layer, and a source/drain layer which are sequentially laminated on the bearing surface of the first base substrate.

Exemplarily, the gate layer 123 is made of a metal material, such as one or more of molybdenum, copper, and aluminum.

Exemplarily, the gate insulating layer 124 and the insulating layer are made of silicon oxide, silicon nitride, silicon nitride oxide, or the like.

Exemplarily, the active layer 125 is made of a low temperature polysilicon material or a metal oxide semiconductor material such as indium gallium zinc oxide (IGZO).

Exemplarily, the source/drain layer 126 is a single-layer metal film made of aluminum, molybdenum, copper, titanium, and the like, or a multi-layer metal film of a molybdenum layer, an aluminum layer, and a molybdenum layer that are sequentially laminated, or a multi-layer metal film of a titanium layer, an aluminum layer, and a titanium layer that are sequentially laminated, or the like.

Exemplarily, the passivation layer 15 is made of silicon oxide, silicon nitride, or silicon nitride oxide.

Exemplarily, the planarization layer 16 is made of an organic insulating material, such as resin.

Figure 8:
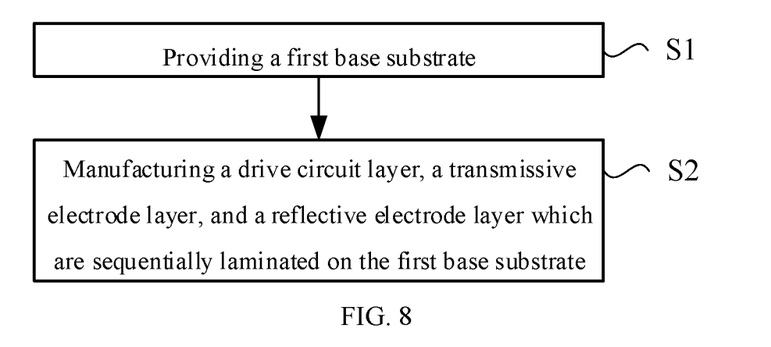
FIG. 8 is a flowchart of a method for manufacturing an array substrate according to some embodiments of the present disclosure.

FIG. 8 is a flowchart of a method for manufacturing an array substrate according to some embodiments of the present disclosure. As shown in FIG. 8, the method includes the following steps.

In step S1, a first base substrate is provided.

In step S2, a drive circuit layer, a transmissive electrode layer, and a reflective electrode layer which are sequentially laminated are manufactured on the first base substrate.

The drive circuit layer includes a plurality of gate lines and a plurality of data lines. The plurality of gate lines extend in a first direction, the plurality of data lines extend in a second direction, and the plurality of gate lines and the plurality of data lines intersect to define a plurality of pixel regions. Each pixel region includes a transmissive region and a reflective region, and the transmissive region in at least one of the pixel regions includes a first region and a second region that are connected. In a first direction, the first region is between adjacent two reflective regions, and the length direction of the first region is the same as a second direction. In the second direction, the second region is between adjacent two reflective regions and the length direction of the second region is the same as the first direction. The reflective electrode layer includes a plurality of reflective electrodes, and the plurality of reflective electrodes are in one-to-one correspondence with the plurality of reflective regions and cover the corresponding reflective regions, respectively. The transmissive electrode layer includes a plurality of transmissive electrodes, the plurality of transmissive electrodes are in one-to-one correspondence with the plurality of transmissive regions, and each transmissive electrode at least covers the corresponding transmissive region.

Exemplarily, step S2 includes the following steps.

In a first step, an initial gate layer is formed on the first base substrate by, for example, deposition. A photoresist structure is obtained on the initial gate layer by processes such as photoresist coating, exposure, and development, and the initial gate layer is etched using the photoresist structure as a mask to form the gate layer.

In a second step, a gate insulating layer is formed on the gate layer by, for example, deposition, and an active layer is formed on the gate insulating layer. For example, an initial active layer is first formed by deposition on the gate insulating layer, a photoresist structure is obtained by processes such as photoresist coating, exposure, and development, and the initial active layer is etched using the photoresist structure as a mask to form the active layer.

In a third step, a source/drain layer is formed on the active layer by a series of processes such as deposition, photoresist coating, exposure, etching, and stripping.

In a fourth step, an initial passivation layer is formed on the source/drain pattern layer by, for example, deposition. A plurality of via holes exposing the source/drain layer are formed by a series of processes such as photoresist coating, exposure, etching, and stripping, to form the passivation layer. An initial transmissive electrode layer is formed on the passivation layer by, for example, deposition. A photoresist structure is obtained on the initial transmissive electrode layer by processes such as photoresist coating, exposure, and development, and the initial transmissive electrode layer is etched using the photoresist structure as a mask to form a transmissive electrode layer. The transmissive electrode layer is electrically connected to the source/drain layer through the via holes in the passivation layer.

In a fifth step, an initial planarization layer is formed on the transmissive electrode layer by, for example, deposition, and a planarization layer is formed by a series of processes such as photoresist coating, exposure, etching, and stripping. An initial reflective electrode layer is formed on the planarization layer by, for example, deposition. A photoresist structure is obtained on the initial reflective electrode layer by processes such as photoresist coating, exposure, and development, and the initial reflective electrode layer is etched using the photoresist structure as a mask to form the reflective electrode layer.

For the materials of the various layers, please refer to the foregoing embodiments, and details are not repeated herein.

Figure 9:
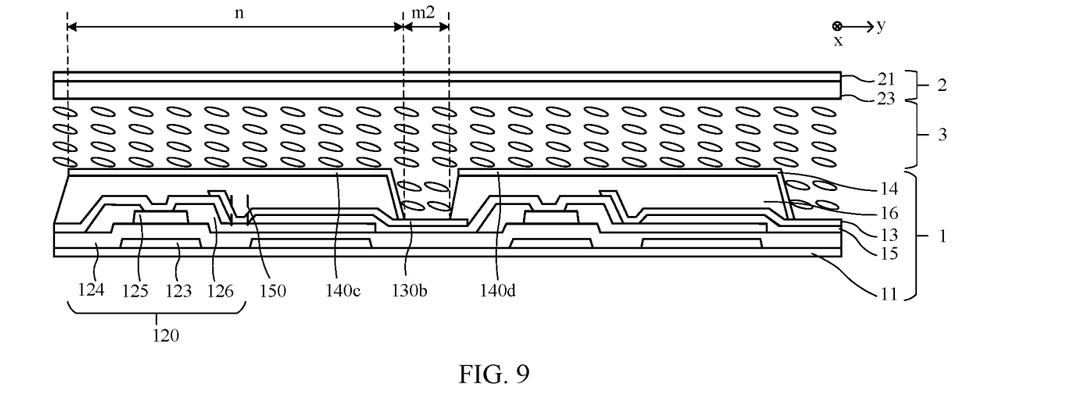
FIG. 9 is a schematic diagram of a cross-sectional structure of a display panel according to some embodiments of the present disclosure.

FIG. 9 is a schematic diagram of a cross-sectional structure of a display panel according to some embodiments of the present disclosure. As shown in FIG. 9, the display panel includes a first substrate 1 and a second substrate 2 facing each other, and a liquid crystal layer 3 disposed between the first substrate 1 and the second substrate 2. The first substrate 1 is the aforementioned array substrate 1, and the display panel has the same effects as the aforementioned array substrate 1, which are not repeated herein.

Figure 10:
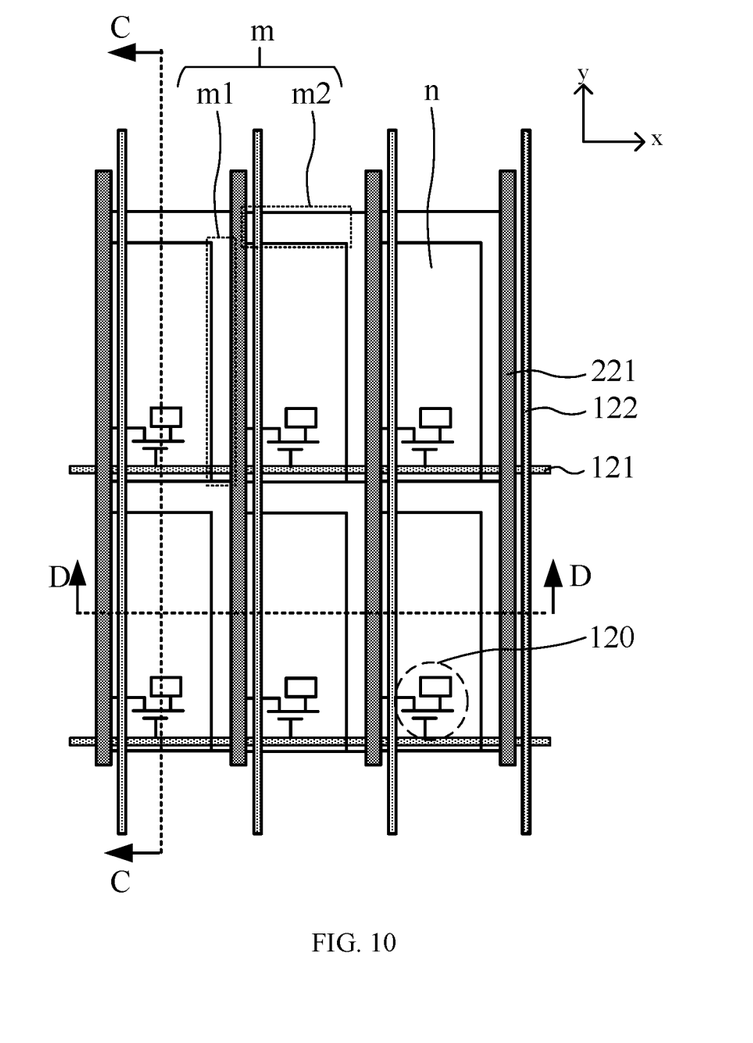
FIG. 10 is a schematic diagram of a planar structure of a display panel according to some embodiments of the present disclosure.
Figure 11:
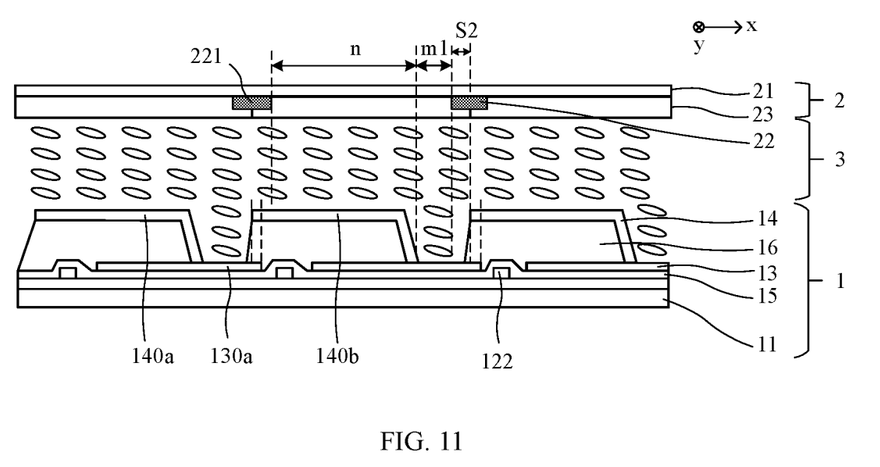
FIG. 11 is a schematic diagram of a cross-sectional structure of a display panel according to some embodiments of the present disclosure.

FIG. 10 is a schematic diagram of a planar structure of a display panel according to some embodiments of the present disclosure; and FIG. 11 is a schematic diagram of another cross-sectional structure of a display panel according to some embodiments of the present disclosure. As shown in FIG. 9 and FIG. 11, the second substrate 2 includes a second base substrate 21, and a light-shielding layer 22 and a color film layer 23 which are laminated on the second base substrate 21. The color film layer 23 includes a plurality of color resistance blocks arranged in an array along the first direction x and the second direction y. The plurality of color resistance blocks are in one-to-one correspondence with the plurality of pixel regions, and one color resistance block is provided in each pixel region. Two color resistance blocks adjacent in the second direction y are the same in color. Exemplarily, as shown in FIG. 9, the plurality of color resistance blocks arranged in the second direction y are of an integral structure. As shown in FIG. 11, two color resistance blocks adjacent in the first direction x are different in color.

Referring to FIG. 10 and FIG. 11, the light-shielding layer 22 includes a plurality of light-shielding strips 221, the plurality of light-shielding strips 221 are disposed between the plurality of color resistance blocks, and the plurality of light-shielding strips 221 are disposed in parallel and spaced apart from each other and extend along the second direction y. As described above, the orthographic projection of the data line 122 on the first base substrate partially overlaps with the orthographic projection of the reflective electrode 140 on the first base substrate, and the data line 122 is disposed between the first base substrate and the reflective electrode 140. Therefore, the data line 122 is shielded by the reflective electrode 140, without the need to use the light-shielding strip 221 to shield the data line 122. The light-shielding strip 221 and the data line 122 are arranged in parallel in the second direction y.

For a display panel of color display, in the second direction y, adjacent two pixel regions correspond to the same color, and thus there is no risk of color crosstalk. Therefore, the light-shielding strips extending in the first direction x are not provided, and only the light-shielding strips extending in the second direction y are provided. Moreover, for the width of the light-shielding strip, only the process alignment deviation needs to be taken into account, and the width of the light-shielding strip is not limited by the limiting distance, which increases the aperture ratio. Here, the process alignment deviation refers to the dimensional deviation of the first substrate 1 and the second substrate 2 in directions parallel to the first direction x and the second direction y when the first substrate 1 and the second substrate 2 are aligned. In some embodiments, the process alignment deviation is 2 μm.

In some embodiments, the size of the light-shielding strip 221 in the first direction x is greater than or equal to 4 μm.

In some embodiments, the size of the light-shielding strip 221 in the first direction x is smaller than the size of the pixel region in the first direction x.

TABLE 1

Percentage increase in aperture ratio for different PPI products in the embodiments of the present disclosure

| | Related art | Present disclosure | Related art | Present disclosure | Related art | Present disclosure | Related art | Present disclosure |
|---|---|---|---|---|---|---|---|---|
| PPI | 150 | | 200 | | 250 | | 300 | |
| Pixel size | 56.3*169.2 | | 42.3*126.9 | | 33.9*101.7 | | 28.2*84.6 | |
| Width of light-shielding strip extending in a first direction (μm) | 10 | 4 | 10 | 4 | 10 | 4 | 10 | 4 |
| Width of light-shielding strip extending in a second direction (μm) | 6 | 0 | 6 | 0 | 6 | 0 | 6 | 0 |
| Aperture ratio of the transmissive region and reflective region | 79.30% | 92.90% | 72.7% | 90.5% | 66.3% | 88.2% | 60.0% | 85.8% |
| Percentage increase in aperture ratio | 17.2% | | 24.5% | | 32.9% | | 43.1% | |

Table 1 shows the percentage of increase in the aperture ratio for different PPI (pixels per inch, pixel density unit) products in the embodiments of the present disclosure. As can be seen from table 1, compared with the related art, the aperture ratios for products having PPIs of 150, 200, 250 and 300 in the embodiments of the present disclosure are all increased, and are increased by 17.2%, 24.5%, 32.9%, and 43.1%, respectively. The aperture ratios for higher PPI products are increased more obviously.

Exemplarily, the display panel adopts a normally white mode, i.e., the liquid crystals are not light-transmissive and are in a dark state when a voltage is applied, and the liquid crystals are light-transmissive and are in a bright state when no voltage is applied. In the normally white mode, the states of the liquid crystals in the dark state are controlled by an electric field, and the orientations of the liquid crystal molecules are uniformly controlled by the electric field at the segment difference position where the transmissive electrode and the reflective electrode are lapped, and thus a better contrast ratio can be achieved. In contrast, in the normally black mode, i.e., the liquid crystals are light-transmissive and are in the bright state when a voltage is applied, and the liquid crystals are not light-transmissive and are in a dark state when no voltage is applied, the brightness in the dark state is determined by the initial alignments of the liquid crystal molecules, and the alignments of the liquid crystal molecules are non-uniform at the segment difference position where the transmissive electrode and the reflective electrode are lapped, thereby resulting in a certain degree of light leakage in the black state. The normally black mode is common in vertical alignment (VA) or electronically controlled birefringence (ECB) type display panels. The polarizer in the VA type display panel is usually a polarizing layer, a ½ wave plate, or a ¼ wave plate, and the polarizer in the ECB type display panel is usually a polarizing layer or a ½ wave plate. The normally white mode is common in twisted nematic (TN) or ECB type display panels, and the polarizers in these two types of display panels are usually polarizing layers, ½ wave plates or ¼ wave plates.

In another possible implementation, for a display panel of a monochrome display (e.g. black and white display), the second substrate 2 includes a transparent substrate only. Since there is no risk of color crosstalk in both the first direction x and the second direction y, there is no need to disposed a light-shielding structure, and the aperture ratio of the display panel of monochrome display approximates 100%.

The embodiments of the present disclosure provide a display device, including any one of the aforementioned display panels and a backlight module. The backlight module is configured to provide a light source for the display panel.

Exemplarily, the display device provided in the embodiments of the present disclosure is any product or component having a display function, such as an outdoor electronic billboard, an outdoor charging piles, a mobile phone, a tablet computer, a television, a display, a laptop computer, a digital photo frame, and a navigator. The display device is particularly widely used in outdoor electronic billboards, outdoor charging piles, and other scenarios due to its advantages of high reliability, good outdoor picture quality, low power consumption and the like.

The display device has the same effects as the aforementioned display panel, and detailed are not repeated herein.

The technical solutions in the present disclosure can at least have the following beneficial effects. The distance between adjacent two reflective regions needs to be greater than or equal to the limiting distance, to avoid the short-circuit caused by lapping due to the excessive short distance between adjacent two reflective electrodes. By arranging a transmissive region between adjacent two reflective regions in both the first direction and the second direction, the space between adjacent two reflective electrodes in first direction and the second direction can be fully utilized, thereby increasing the aperture ratio of the display panel under the premise of ensuring that the ratio of the area of the transmissive region to the area of the reflective region is the same as that in the related art.

Described above are merely optional embodiments of the present disclosure, and are not intended to limit the present disclosure. Within the spirit and principles of the present disclosure, any modifications, equivalent substitutions, improvements, and the like are within the protection scope of the present disclosure.

The invention claimed is:

1. An array substrate, wherein the array substrate comprises a first base substrate, and a drive circuit layer, a transmissive electrode layer and a reflective electrode layer which are sequentially laminated on the first base substrate; wherein
the drive circuit layer comprises a plurality of gate lines and a plurality of data lines, wherein the plurality of gate lines extend in a first direction, the plurality of data lines extend in a second direction, and the plurality of gate lines and the plurality of data lines intersect to define a plurality of pixel regions;
wherein each of the pixel regions comprises a transmissive region and a reflective region, and the transmissive region in at least one of the pixel regions comprises at least one first region and at least one second region that are connected to each other, wherein the first region is between adjacent two reflective regions in the first direction and a length direction of the first region is the same as the second direction, and the second region is between adjacent two reflective regions in the second direction and a length direction of the second region is the same as the first direction;
the reflective electrode layer comprises a plurality of reflective electrodes, wherein the plurality of reflective electrodes are in one-to-one correspondence with a plurality of reflective regions and cover the corresponding reflective regions, respectively; and
the transmissive electrode layer comprises a plurality of transmissive electrodes, wherein the plurality of transmissive electrodes are in one-to-one correspondence with a plurality of transmissive regions, and each of the transmissive electrodes at least covers the corresponding transmissive region.

2. The array substrate according to claim 1, wherein the transmissive region in at least one of the pixel regions comprises one first region and one second region.

3. The array substrate according to claim 1, wherein the plurality of pixel regions comprise a first pixel region and a second pixel region that are adjacent to each other in the first direction, wherein the reflective electrode in the first pixel region is a first reflective electrode, the reflective electrode in the second pixel region is a second reflective electrode, and the transmissive electrode in the first pixel region is a first transmissive electrode; wherein
an orthographic projection of the first transmissive electrode on a bearing surface of the first base substrate overlaps with orthographic projections of the first reflective electrode and the second reflective electrode on the bearing surface of the first base substrate.

4. The array substrate according to claim 1, wherein the plurality of pixel regions comprise a third pixel region and a fourth pixel region that are adjacent to each other in the second direction, wherein the reflective electrode in the third pixel region is a third reflective electrode, the reflective electrode in the fourth pixel region is a fourth reflective electrode, and the transmissive electrode in the third pixel region is a second transmissive electrode; wherein
an orthographic projection of the second transmissive electrode on a bearing surface of the first base substrate overlaps with orthographic projections of the third reflective electrode and the fourth reflective electrode on the bearing surface of the first base substrate.

5. The array substrate according to claim 1, wherein
in the first direction, a spacing between the reflective regions of adjacent two pixel regions is greater than or equal to 6 μm; and
in the second direction, a spacing between the reflective regions of adjacent two pixel regions is greater than or equal to 6 μm.

6. The array substrate according to claim 1, wherein the drive circuit layer further comprises a plurality of pixel drive circuits, the plurality of pixel drive circuits being in one-to-one correspondence with the plurality of pixel regions; wherein
the plurality of pixel drive circuits are disposed in the reflective regions of the corresponding pixel regions, respectively.

7. The array substrate according to claim 6, wherein the array substrate further comprises a passivation layer, the passivation layer being disposed between the drive circuit layer and the transmissive electrode layer; wherein
the passivation layer is provided with a plurality of via holes, each the pixel drive circuits is electrically connected to the corresponding transmissive electrode through at least one of the via holes, and each of the via holes is in the reflective region of the corresponding pixel region.

8. The array substrate according to claim 7, wherein the array substrate further comprises a planarization layer, wherein the planarization layer is disposed between the reflective electrode layer and the transmissive electrode layer.

9. The array substrate according to claim 8, wherein
the planarization layer comprises a plurality of isolation blocks, wherein the plurality of isolation blocks are in one-to-one correspondence with the plurality of pixel regions, and the plurality of isolation blocks are disposed in the corresponding pixel regions, respectively;
in a same pixel region, the reflective electrode is disposed on a top surface and least one sidewall of a plurality of sidewalls of the isolation block, and a side surface, away from the top surface of the isolation block, of the reflective electrode disposed on the sidewall is connected to a transmissive electrode.

10. The array substrate according to claim 1, wherein an orthographic projection of the data line on a bearing surface of the first base substrate at least partially overlaps with an orthographic projection of the reflective electrode on the bearing surface of the first base substrate.

11. The array substrate according to claim 1, wherein the reflective electrode layer is made of argentum or aluminum.

12. A method for manufacturing an array substrate, comprising:
providing a first base substrate; and
manufacturing a drive circuit layer, a transmissive electrode layer and a reflective electrode layer which are sequentially laminated on a side of the first base substrate;
wherein the drive circuit layer comprises a plurality of gate lines and a plurality of data lines, the plurality of gate lines extend in a first direction, the plurality of data lines extend in a second direction, and the plurality of gate lines and the plurality of data lines intersect to define a plurality of pixel regions;
wherein each of the pixel regions comprises a transmissive region and a reflective region, and the transmissive region in at least one of the pixel regions comprises at least one first region and at least one second region that are connected to each other, wherein the first region is between adjacent two reflective regions in the first direction and a length direction of the first region is the same as the second direction, and the second region is between adjacent two reflective regions in the second direction and a length direction of the second region is the same as the first direction;
the reflective electrode layer comprises a plurality of reflective electrodes, wherein the plurality of reflective electrodes are in one-to-one correspondence with a plurality of reflective regions and cover the corresponding reflective regions, respectively; and
the transmissive electrode layer comprises a plurality of transmissive electrodes, wherein the plurality of transmissive electrodes are in one-to-one correspondence with a plurality of transmissive regions, and each of the transmissive electrodes at least covers the corresponding transmissive region.

13. A display panel, comprising: a first substrate and a second substrate facing each other, and a liquid crystal layer disposed between the first substrate and the second substrate, wherein the first substrate is the array substrate as defined in claim 1.

14. The display panel according to claim 13, wherein the second substrate comprises a transparent substrate.

15. The display panel according to claim 13, wherein the second substrate comprises a second base substrate, and a light-shielding layer and a color film layer which are laminated on the second base substrate, wherein the color film layer comprises a plurality of color resistance blocks arranged in an array in the first direction and the second direction, wherein the plurality of color resistance blocks are in one-to-one correspondence with the plurality of pixel regions, adjacent two color resistance blocks in the second direction are the same in color, and adjacent two color resistance blocks in the first direction are different in color; and the light-shielding layer comprises a plurality of light-shielding strips, wherein the plurality of light-shielding strips are disposed between the plurality of color resistance blocks, and the plurality of light-shielding strips are arranged in parallel and spaced apart from each other and extend in the second direction.

16. The display panel according to claim 13, wherein the transmissive region in at least one of the pixel regions comprises one first region and one second region.

17. The display panel according to claim 13, wherein the plurality of pixel regions comprise a first pixel region and a second pixel region that are adjacent to each other in the first direction, wherein the reflective electrode in the first pixel region is a first reflective electrode, the reflective electrode in the second pixel region is a second reflective electrode, and the transmissive electrode in the first pixel region is a first transmissive electrode; wherein
an orthographic projection of the first transmissive electrode on a bearing surface of the first base substrate overlaps with orthographic projections of the first reflective electrode and the second reflective electrode on the bearing surface of the first base substrate.

18. The display panel according to claim 13, wherein the plurality of pixel regions comprise a third pixel region and a fourth pixel region that are adjacent to each other in the second direction, wherein the reflective electrode in the third pixel region is a third reflective electrode, the reflective electrode in the fourth pixel region is a fourth reflective electrode, and the transmissive electrode in the third pixel region is a second transmissive electrode; wherein
an orthographic projection of the second transmissive electrode on a bearing surface of the first base substrate overlaps with orthographic projections of the third reflective electrode and the fourth reflective electrode on the bearing surface of the first base substrate.

19. A display device, comprising the display panel as defined in claim 13 and a backlight module, wherein the backlight module is configured to provide a light source for the display panel.

* * * * *